(12) United States Patent
Britton et al.

(10) Patent No.: US 8,579,415 B2
(45) Date of Patent: Nov. 12, 2013

(54) INKJET PRINTING OF NANOPARTICULATE FUNCTIONAL INKS

(75) Inventors: David Thomas Britton, Cape Town (ZA); Ekundare Ayodele Odo, Mowbray (ZA); Margit Harting, Mowbray (ZA)

(73) Assignee: PST Sensors (Proprietary) Limited, Cape Town (ZA)

( * ) Notice: Subject to any disclaimer, the term of this patent is extended or adjusted under 35 U.S.C. 154(b) by 171 days.

(21) Appl. No.: 12/995,916

(22) PCT Filed: Jun. 2, 2009

(86) PCT No.: PCT/IB2009/052317
§ 371 (c)(1),
(2), (4) Date: Dec. 22, 2010

(87) PCT Pub. No.: WO2009/147619
PCT Pub. Date: Dec. 10, 2009

(65) Prior Publication Data
US 2011/0080452 A1  Apr. 7, 2011

(30) Foreign Application Priority Data

Jun. 2, 2008  (ZA) .................................. 2008/04765

(51) Int. Cl.
*B41J 2/06* (2006.01)
*B41J 2/035* (2006.01)

(52) U.S. Cl.
USPC .................................. 347/55; 347/75; 347/76

(58) Field of Classification Search
None
See application file for complete search history.

(56) References Cited

U.S. PATENT DOCUMENTS

2005/0219323 A1  10/2005  Kusakari

FOREIGN PATENT DOCUMENTS

| EP | 0 761 441 A | 3/1997 |
| EP | 0 997 282 A | 5/2000 |
| GB | 2355338 A | 4/2001 |
| WO | WO 2004/068536 A | 8/2004 |

*Primary Examiner* — Jerry Rahll
(74) *Attorney, Agent, or Firm* — Frommer Lawrence & Haug LLP; Ronald R Santucci

(57) ABSTRACT

Apparatus for depositing ink on a substrate includes a nozzle defining an outlet for the ink, with at least a portion of the nozzle being electrically conductive. A first voltage source applies a first potential to the outlet nozzle. One or more auxiliary electrodes are located adjacent the outlet nozzle, and a second voltage source applies a second potential to the auxiliary electrodes. The apparatus includes a piezo-electric or thermal actuator for expelling ink from the nozzle towards a target zone on a substrate, the ink comprising a liquid vehicle and pigment particles dispersed in the vehicle. At least the pigment particles are electrically charged, typically due to the applied potentials. In one embodiment, an auxiliary electrode is disposed coaxially around the electrode formed by the nozzle. In another embodiment, an auxiliary electrode located beyond the nozzle, on a common axis with the electrode formed by the nozzle. The configuration of the nozzle, the auxiliary electrodes, and the values of the first and second potentials are selected to cause pigment particles to be concentrated in the target zone, so that a quantity of the pigment particles is deposited in the target zone having a higher concentration than the concentration of the pigment particles in the ink. The invention extends to a method of depositing ink on a substrate.

20 Claims, 3 Drawing Sheets

INKJET PRINTING OF NANOPARTICULATE FUNCTIONAL INKS

This application is a 371 of PCT/IB2009/052317 filed on Jun. 2, 2009, published on Dec. 10, 2010 under publication number WO 2010/147619 A and claims priority benefits of South African Patent Application Number 2008/04765 filed Jun. 2, 2008, the disclosure of which is incorporated herein by reference.

BACKGROUND OF THE INVENTION

The present invention relates to a method of inkjet printing of inks containing nanoparticles, and to printing apparatus for carrying out the method.

The method and apparatus are particularly, but not exclusively, suitable for printing of functional inks for electronic applications, where a high density of interconnecting particles and small feature size of the printed pattern are required.

Printing of functional inks has a long tradition in the electronic field. For example, pigment based inks are used to screen print interconnections and resistors on printed circuit boards. In these applications the thick film inks used consist of a vehicle, and pigments of silver and carbon respectively, where the pigment particles can have a dimension in the nanometer range. More recent developments are aimed at printing not only the passive components of a circuit, but also active components. One example is the disclosure of printed nanoparticulate silicon in International patent application WO 2004/068536 of the present applicant, providing semiconducting layers in devices like solar cells and transistors.

Traditionally most functional materials have been printed by conventional printing techniques, such as screen printing and flexography, both of which require the fabrication of a master pattern (e.g. a screen or printing plate) for each design to be printed. It is generally held desirable that digital printing methods, such as inkjet printing, should be applied, because of their flexibility in use and higher spatial accuracy. However, to prevent clogging of the ink jet nozzles, ink jet printing requires relatively dispersed solutions of particles and a low viscosity ink. This makes this method unsuitable for certain applications in the electronic field, in which a high density of particles has to be brought to a specific position on a substrate to achieve the required functionality of the printed pattern.

With regard to the deposition of small feature size patterns, inkjet printing of solutions containing nanoparticles, which provide functional properties to a printed structure, is known. The most common applications are ink jet printing of conductive traces for circuits, using conductive nanoparticles, e.g. silver nanoparticles, dispersed in the ink. In such applications a low resistance is obtained by heat treatment, with the effect of removing the dispersant, and subsequent sintering of the nanoparticles. A more recent development in functional layer deposition is inkjet printing of nanoparticulate transparent conducting oxide, where the patterned structure and the particle packing is controlled by a treatment with electromagnetic radiation in the drying process.

Another method to enhance the precision of patterning in ink jet printed structures composed of functional inks, including inks containing nanoparticles, is electrohydrodynamic jet printing, described by Jang-Ung Park et al (Nature, Vol 6 (2007) p. 782). In this case the resolution of the printed pattern is enhanced by an electrostatic field, applied to a microcapillary nozzle of the ink jet equipment, which shapes and controls the motion of the drops ejected from the nozzle. However, electrohydrodynamic jet printing has no effect on the density or arrangement of particles in the printed structure, and post processing is necessary to achieve the desired properties.

In certain applications the functionality of a deposited layer, containing particles in general, and nanoparticles in particular, is provided by an interconnecting network of these particles. To achieve compaction of such layers a modification of electrophoretic deposition has been disclosed by Tuck in GB2355338 for field emitting displays. This work teaches the forced sedimentation of particles from a dilute solution of the binder material by an applied electric field. The amount of binder in the solution is carefully calculated so that, after evaporation of the solvent, the sediment is held in place at the bottom of a microscopic well. As in other conventional electrophoretic deposition techniques, used for coating from a bath of solution, there is no forming of the pattern or control of the fluid flow during the process.

SUMMARY OF THE INVENTION

According to the invention there is provided a method of depositing ink on a substrate, the method including:
  preparing an ink comprising a liquid vehicle and pigment particles dispersed in the vehicle, at least the pigment particles being electrically charged;
  applying a first potential to an outlet nozzle for the ink;
  applying at least a second potential to one or more auxiliary electrodes located adjacent the outlet nozzle; and
  expelling droplets of ink from the outlet nozzle towards a target zone on a substrate,
the configuration of the outlet nozzle and said one or more auxiliary electrodes, and the values of the first and second potentials, being selected to cause pigment particles to be concentrated in the target zone, thereby to deposit a quantity of the pigment particles in the target zone having a higher concentration than the concentration of the pigment particles in the ink.

The pigment particles may have a permanent charge, or may have an induced charge. In the latter case, the charge on the particles may be induced by the applied potentials.

The method is preferably designed to utilise the applied potentials to cause electrophoretic motion of the pigment during the deposition process, to concentrate the pigment particles in the target zone.

The method is preferably further designed to utilise the applied potentials to generate electrohydrodynamic forces on the liquid vehicle of the ink, to cause the liquid vehicle to be dispersed away from the target zone.

The one or more auxiliary electrodes located adjacent the outlet nozzle may be disposed coaxially around the electrode formed by the nozzle.

The substrate may be maintained at a defined potential while droplets of ink are expelled from the nozzle towards the target zone.

Preferably, the substrate is maintained at ground or earth potential.

Preferably, the potential difference between the outlet nozzle and the one or more auxiliary electrodes is at least as great as the potential difference between the outlet nozzle and the substrate.

In a preferred embodiment of the method, the potential difference between the outlet nozzle and the one or more auxiliary electrodes is in the range of 1 to 100V.

The method may comprise locating at least one auxiliary electrode behind the substrate on a common axis with the electrode formed by the nozzle.

In one embodiment of the method, an additional base plate which supports the substrate is maintained at a defined potential.

Preferably, the base plate is maintained at ground or earth potential.

In one embodiment, the base plate is located behind the substrate, that is, with the substrate located between the nozzle and the base plate.

In another embodiment, the base plate is located between the substrate and the nozzle.

Where at least one auxiliary electrode is located behind the substrate, the nozzle and said at least one auxiliary electrode behind the substrate may be movable relative to the substrate, the movement of the nozzle and said at least one auxiliary electrode being synchronized.

In another embodiment, a plurality of electrodes and corresponding holes in a base plate are kept at fixed absolute positions.

In a further embodiment, the nozzle and the auxiliary electrodes are kept in a fixed position and the substrate is moved relative thereto.

Preferably, the potential of the auxiliary electrode is maintained more attractive to the charged nanoparticles than the potential of the nozzle.

In a preferred embodiment, the ratio of the potentials of the auxiliary electrode and the nozzle is maintained greater than the ratio of the radius of a hole in the base plate adjacent the auxiliary electrode, and the radius of the nozzle.

Further according to the invention there is provided apparatus for depositing ink on a substrate, the apparatus including:
 a nozzle defining an outlet for the ink, at least a portion of the nozzle being electrically conductive;
 a first voltage source for applying a first potential to the outlet nozzle;
 one or more auxiliary electrodes located adjacent the outlet nozzle;
 a second voltage source for applying a second potential to said one or more auxiliary electrodes; and
 means for expelling ink from the nozzle towards a target zone on a substrate, the ink comprising a liquid vehicle and pigment particles dispersed in the vehicle, at least the pigment particles being electrically charged;
the configuration of the nozzle and said one or more auxiliary electrodes, and the values of the first and second potentials being selected to cause pigment particles to be concentrated in the target zone, thereby to deposit a quantity of the pigment particles in the target zone having a higher concentration than the concentration of the pigment particles in the ink.

In one embodiment, the one or more auxiliary electrodes located adjacent the outlet nozzle may be disposed coaxially around the electrode formed by the nozzle.

The voltage sources may be arranged to maintain the potential difference between the outlet nozzle and the one or more auxiliary electrodes to be at least as great as the potential difference between the outlet nozzle and the substrate.

Preferably, the voltage sources are arranged to maintain the potential difference between the outlet nozzle and the one or more auxiliary electrodes in the range of 1 to 100V.

In another embodiment, at least one auxiliary electrode may be located beyond the nozzle, that is, with the substrate located between the nozzle and the base plate, on a common axis with the electrode formed by the nozzle, so that the substrate is between the nozzle and said at least one auxiliary electrode in use.

The apparatus may include a base plate arranged to support the substrate, the base plate being maintained at a defined potential.

The voltage sources may be arranged to maintain the potential of the auxiliary electrode more attractive to the charged nanoparticles than the potential of the nozzle.

Preferably, the voltage sources are arranged to maintain the ratio of the potentials of the auxiliary electrode and the nozzle greater than the ratio of the radius of a hole in the base plate adjacent the auxiliary electrode and the radius of the nozzle.

The invention concerns a method of separation and compaction of the pigment particles during inkjet printing by a combination of electrophoretic and electrohydrodynamic effects, which are achieved by the application of non-linear or non-uniform focusing electric fields. Two goals of such a process are firstly to allow the printing of small areas with a high packing density of particles, and secondly to produce a high definition pattern with a small feature size. Particular applications are for the printing of electronic components and circuits which require dense layers of interconnecting semiconducting nanoparticles. Embodiments of the invention, as herein disclosed, further include the specific aspects of the printing system which are required to form the electric fields required. These are described with reference to two preferred embodiments.

For the purposes of this application an ink can be considered as being composed of two components, a pigment which consists of small particles, and a vehicle, which is a liquid composed of a binder, a solvent and any other suitable liquid or soluble additives such as surfactants, humectants, or siccatives. Preferably the pigment particles are nanoparticles with a characteristic size between 1 nm and 1 micron, although larger particles may be used. In inkjet printing it is generally acknowledged that the pigment should be uniformly dispersed in the vehicle, without agglomeration, and that the viscosity of the ink should be relatively low, to prevent clogging of the printing nozzles.

Generally these considerations are incompatible with the properties of printed layers of electronic materials, which must be highly agglomerated to allow transfer of charge between individual particles. Hence, further processing steps, such as sintering or pyrolysis of the binder material, are required to obtain good connection between the particles. If the particles can be brought together in the printing process, and separated from the majority of the vehicle, the subsequent steps may be avoided, and such devices can be printed directly. In the method and apparatus of the present invention this is achieved by a combination of electrophoresis, to impart motion to the pigment, and electrohydrodynamics, to spread the liquid phase of the drop.

DESCRIPTION OF EMBODIMENTS

Although both electrophoretic deposition and electrohydrodynamic jet printing are known, as discussed above, the combination of both in the same process is counterintuitive, and non-trivial to achieve. The key to the method is that the pigment particles must carry a defined charge, and the vehicle must either carry an opposite charge or remain neutral. These charges may be either permanent or induced by the application of electric potentials during the printing process or during feed to the print head.

In the situation where both particles and vehicle are charged, an applied electric field will cause an absolute motion of both particles and liquid. In the case where the particles are charged but the vehicle is not, although the liquid vehicle will be unaffected by the electric field, the solid matter will still experience a force. In both cases, however, there will be relative motion of the two components, with a concentration of the pigment in a particular area. Preferably, the concentration of the particles should be at the centre of the drop, directly aligned with the axis of the ink jet nozzle. For this to occur, the electric field should have a radial component in the space between the nozzle and the substrate. Hence, depending on the charge carried by the particles the electric field must be either divergent or convergent as the drop approaches the substrate. How this situation can be achieved is described with reference to the following preferred embodiments.

Figure 1:
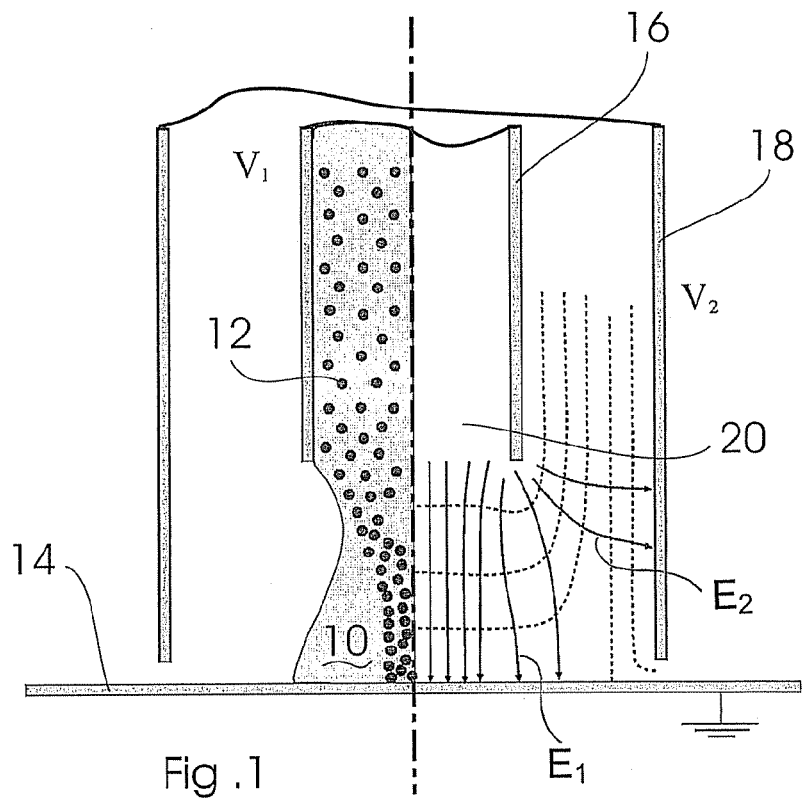
FIG. 1 is a schematic sectional diagram of a first embodiment of an ink jet nozzle according to the invention, comprising coaxial tubes.

In FIG. 1, a first embodiment of apparatus according to the invention comprising an inkjet nozzle structure is shown schematically. The apparatus includes means (not shown in this figure) for expelling ink from the nozzle which can utilise, for example, thermal or piezo-electric technology as is well known to those skilled in the art of inkjet printing. An ink consisting of a liquid vehicle 10 and a nanoparticulate pigment 12 is to be printed onto a substrate 14. The pigment nanoparticles should carry a defined electric charge, which for the purposes of this example is negative. The liquid vehicle may be either neutral, or carry the opposite charge, which in this case is positive. The charge may be the result of an intrinsic charge separation in the ink, or may be induced by the application of a potential $V_1$, which is applied to a first, inner tube 16 of two coaxial conducting tubes 16 and 18. The tube 16 serves both as an electrode, and defines a nozzle 20 at its lower end for delivering the ink to the substrate.

The potential $V_1$ is opposite to the charge on the nanoparticles, and for the purpose of the example is assumed to be positive. The substrate 14 is assumed to form an equipotential plane, which is preferably at ground potential. This is normally the case if the substrate is itself conducting, or consists of a thin dielectric material mounted on a conducting carrier. For thick insulating substrates a number of established methods can be used to maintain a constant potential.

The second, outer coaxial tube 18, which extends below the lower end of the nozzle 20, is maintained at a potential $V_2$ and serves as a Wehnelt electrode. The potential $V_2$ should be such that it is repulsive to the charged nanoparticles, and in this case is negative. In a further modification of this embodiment, a multiplicity of such coaxial electrodes could be further used to define the electric field. Alternatively, one of the said electrodes could take the form of a flat plate, with a hole which is coaxial with the other electrodes and is positioned between the substrate and the nozzle 20.

The right half of FIG. 1 shows the potential and electric fields arising in such a situation. Immediately below the nozzle 20 the electric field $E_1$ arising from the applied potential $V_1$ is aligned with the axis of the nozzle 20 and is directed towards the substrate, and thus has no effect on the trajectory of either the liquid of the ink exiting the nozzle, or the pigment nanoparticles within it. For material slightly off centre, however, the particles experience an electrophoretic drift towards the axis of the nozzle due to the effect of the transverse component of the radially divergent electric field $E_2$ arising from the applied potential $V_2$. To achieve a highly divergent electric field the potential difference between $V_2$ and $V_1$ should be at least as great as the potential difference between $V_1$ and the substrate, for the same distance. If the liquid vehicle carries the opposite charge, it experiences an electrohydrodynamic drift radially outwards. The net result is a concentration of particles directly below the nozzle, with a much higher particle to vehicle ratio (or particle to binder ratio), than in the original ink mixture.

Thus, in summary, opposing electric potentials are applied to the coaxial electrodes 16 and 18 to form a non-uniform electric field which directs the pigment particles radially inwardly to the centre of the printed area and concentrates them electrophoretically, while the liquid vehicle is simultaneously directed outwardly, away from the centre of the printed area. As discussed in the examples, to achieve a strong electrophoretic motion of the particles, electric fields of the order of volts per micron are required. Consequently, typical values of $V_1$ and $V_2$ will be in the range of 1-100V, and preferably in the range 5-50 V.

Figure 2:
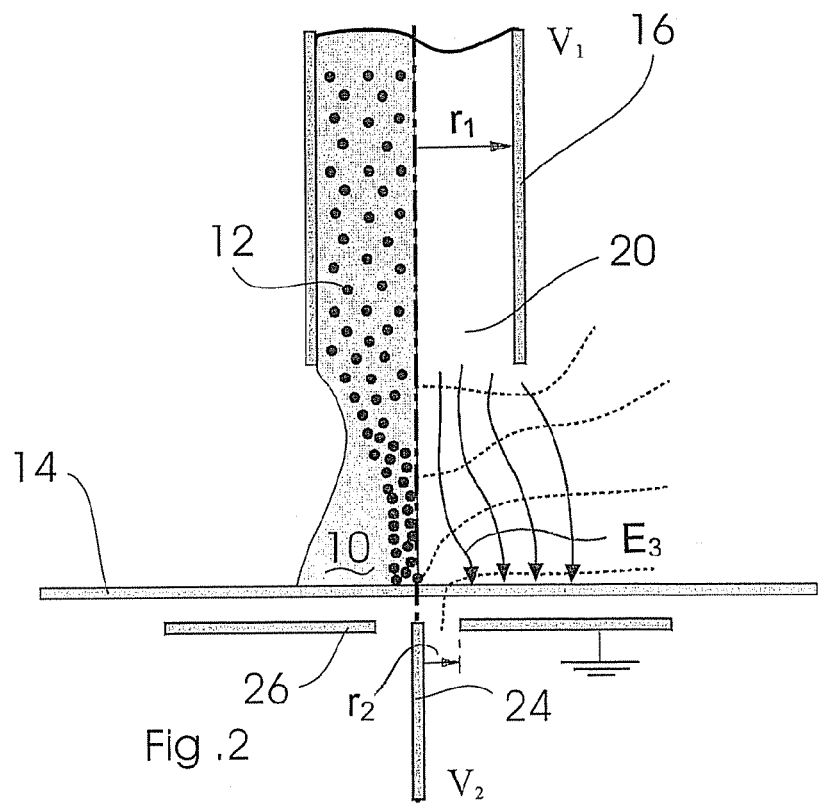
FIG. 2 is a schematic sectional diagram of a second embodiment of an ink jet nozzle according to the invention, comprising a single tube and an associated needle electrode.

In the second embodiment, shown in FIG. 2, only a single tube 16 defining a nozzle 20 is used in the inkjet printing apparatus and the focusing action geometry of the electric field is attained by the presence of a needle electrode 24 immediately behind the substrate 14. The tube 16 has, again, a potential $V_1$ applied to it, while the needle electrode 24 has a potential $V_2$ applied to it. The potential $V_2$ of the needle electrode should be more attractive to the charged nanoparticles than the potential $V_1$ of the nozzle.

In this embodiment, it is necessary for the electric field to penetrate through the substrate 14. Consequently, relatively thin dielectric substrates are preferred. The needle electrode 24 may be a single component, mounted on a gantry, and moved by mechanical means to track the position of the print head containing the nozzle 16. Alternatively, a multiplicity of such electrodes could be mounted in holes at fixed positions, and their potentials switched electrically. A further variation is to keep the positions of the electrodes and nozzles fixed, and move the substrate. In all such cases, an optional back plane 26 could be used to simultaneously support the substrate and define its position, and to increase the convergence of the electric field at the position to be printed. Alternatively, in the case of a thick substrate, the back plane could optionally be placed between the substrate and the nozzle. As shown, the back plane is formed with a hole having a radius $r_2$, with the tip of the needle electrode 24 being located at or adjacent the centre of the hole.

In the case shown, for negatively charged pigment particles 12 in a positively charged vehicle 10, the potentials $V_1$ and $V_2$ are positive, with $V_2$ preferably being greater than $V_1$, and the back plane 26 is maintained at ground potential. As in the first embodiment the effect of an electric field, so produced, is an inward electrophoretic drift of the particles to the centre of the print area, and an outward electrohydrodynamic force on the liquid phase, caused by the transverse component of the divergent electric field $E_3$. As described in the example below, this embodiment will function as envisaged for all potentials $V_2$ greater than or equal to the potential of the back plane, but the secondary electrode will have a greater effect when the ratio of its magnitude ($V_2$) to that of the first electrode ($V_1$) is greater than the ratio of the radius of the hole ($r_2$) to the radius of the nozzle ($r_1$). Ideally this ratio should be $V_2/V_1 > 2\, r_2/r_1$.

Figure 5:
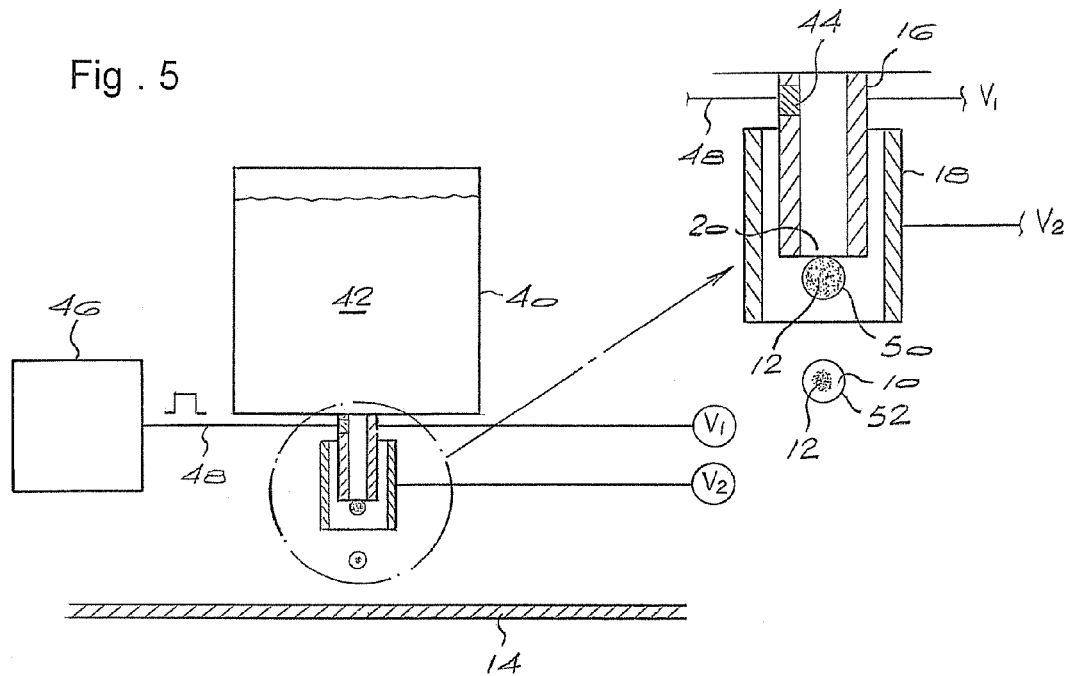
FIG. 5 is a simplified schematic diagram of an embodiment of inkjet printing apparatus according to the invention.

The simplified schematic diagram of FIG. 5, which is not to scale, shows major components of one embodiment of inkjet printing apparatus according to the invention. In FIG. 5, a reservoir 40 contains a quantity of ink 42 which comprises a liquid vehicle 10 and a nanoparticulate pigment 12 as described above. In communication with the reservoir 40 is a nozzle 20 defined at the lowermost end of a conducting inner tube 16 surrounded by a coaxial conducting outer tube 18 as described above with reference to FIG. 1. Within the inner tube 16 is a piezo-electric or thermal actuator 44, connected to a control circuit 46 via a conductor 48. In a manner known as such to those skilled in the art, a brief electrical pulse is transmitted to the actuator 44, causing it to deform momentarily (in the case of a piezo-electric actuator) or to heat and vaporize a small quantity of the liquid vehicle 10 of the ink (in the case of a thermal actuator), thus expelling a drop 50 of ink from the nozzle 20 defined at the open end of the tube 16.

As best seen in the enlarged detail of FIG. 5, the distribution of the pigment nanoparticles 12 within the liquid vehicle 10 is substantially uniform, and thus the distribution of the nanoparticles within the drop 50 as it emerges from the nozzle is substantially uniform. However, due to the effect of the electric fields resulting from the potentials $V_1$ and $V_2$ applied to the tubes 16 and 18 respectively from respective voltage sources, the pigment nanoparticles 12 are concentrated electrophoretically towards the centre of the drop as it falls, as shown in the falling drop 52.

Example 1

Figure 3:
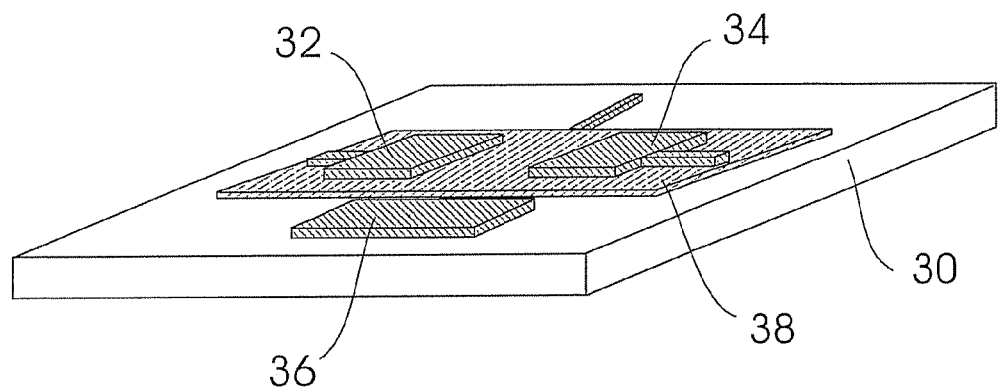
FIG. 3 is a schematic illustration of a transistor test structure formed utilising the principle of the invention.

In a preliminary example, the effect of including electrophoresis into the inkjet printing process has been modeled using single drops deposited, by hand, onto a transistor test structure as shown in FIG. 3. The structure was formed on a substrate 30 comprising polymethylmethacrylate and took the form of a field effect transistor (FET) having a source electrode 32, a drain electrode 34, and a gate electrode 36 deposited on a thin dielectric layer 38.

To produce the transistor structure, a dilute low viscosity ink, without binder, was produced by dispersing silicon nanoparticles in triple distilled water. The silicon nanoparticles were produced by milling according to the process described in South African patent application 2008/02727 entitled "Method of Producing Stable Oxygen Terminated Semiconducting Nanoparticles". To determine the charge on the particles, a potential difference of three volts was applied between the source and drain electrodes. An electrophoretic drift of the particles, in the direction of the positive electrode, indicated that the charge on the particles was negative.

Compaction or concentration of the particles was achieved by applying a positive bias of 20V to the gate electrode, in a similar manner to the needle electrode of the second embodiment described above, with the gate insulator 36 taking the place of the thin dielectric substrate 14. The potentials were maintained until the drop had dried completely. For comparison, a deposition of the same ink on a similar structure, without electric fields, was performed.

Figure 4:
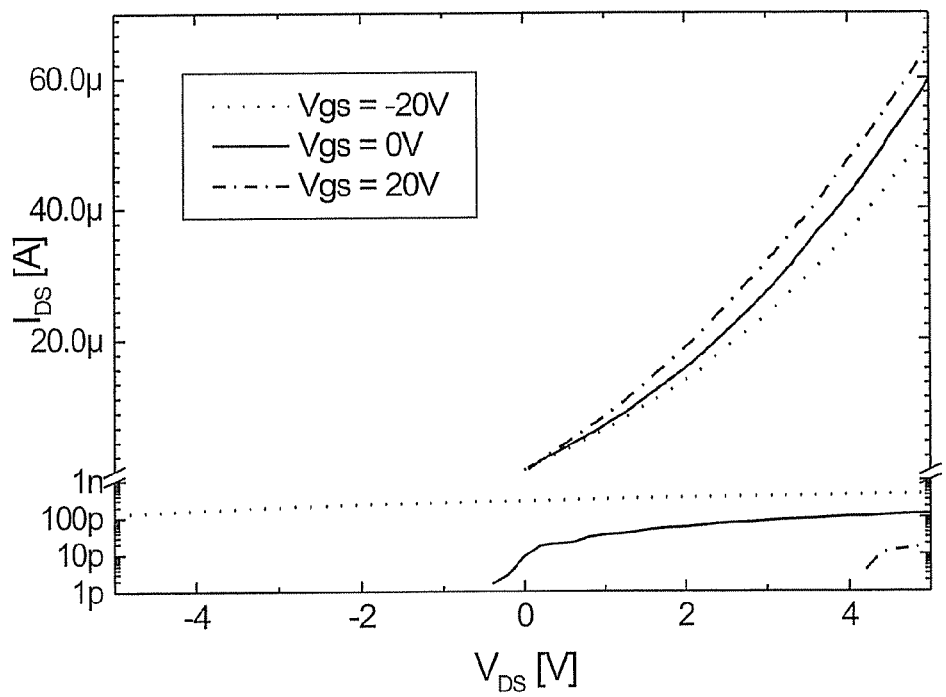
FIG. 4 is a graph comparing source-drain characteristics of a transistor produced by the method of the invention, with an otherwise similar transistor produced without the method of the invention.

FIG. 4 shows the source-drain characteristics of two transistors (i.e. otherwise identical transistors, produced with and without an applied potential during deposition) for different applied gate potentials. The lower curve is for the transistor produced without application of potentials, and the upper curve is for a transistor produced according to the method of the invention.

The first important difference is that the drain-source currents in the transistor containing the compacted nanoparticles are over ten thousand times higher than corresponding currents in the layer deposited without an applied electric field. Secondly, a similar increase is seen in the source-drain current, which is switched by the application of the gate bias.

Example 2

A macroscopic model of the second embodiment described above was constructed to investigate the electrophoretic and electrohydrodynamic effects during droplet deposition. In this model, a 23 gauge (0.6 mm) blunt steel needle, representing the single tube 16 of FIG. 2, was held a distance of 1.5 mm above a solid aluminium backplate held at ground potential. This configuration is equivalent to fixing the potential $V_2$ of the auxiliary needle electrode 24 and the base plate 26 at ground potential. The resulting electric field is therefore uniform along the axis of the nozzle and divergent at radial distances larger than the nozzle radius, thus actually more closely resembling the field pattern shown in FIG. 1 rather than that in FIG. 2.

A dilute low viscosity ink, without binder, was produced by dispersing silicon nanoparticles in triple distilled water. The silicon nanoparticles were produced by milling p-type silicon wafers according to the process described in South African patent application 2008/02727 entitled "Method of Producing Stable Oxygen Terminated Semiconducting Nanoparticles". On poorly absorbing substrates, such as normal office paper, drops of the size deposited in this system remain as liquids for several tens of minutes, allowing a redistribution of the component materials in the ink. To investigate the distribution of material as the drop was deposited, rather than electrophoretic movement of the silicon nanopowder in the stationary liquid on the substrate, a highly absorbing filter paper was therefore used as a substrate material.

Figure 6:
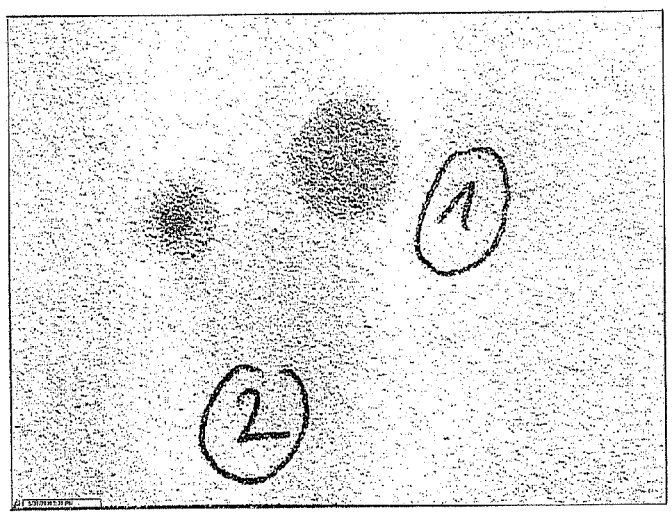
FIG. 6 is a photograph of ink drops containing silicon nanoparticles deposited on filter paper from a nozzle, with an electric potential applied to the nozzle according to the principle of the invention, and by a prior art method.

Application of a negative potential of 1.5 kV to the needle during deposition induced both electrohydrodynamic effects on the liquid vehicle and electrophoretic motion of the silicon nanoparticles relative to the liquid. Both of these effects are seen in FIG. 6 which is a photograph of the dried ink drops deposited with and without an applied electric field. Without application of an electric field the drop (1) is large, and the deposited material is uniformly spread. When an electric potential is applied to the needle, the water vehicle, and hence the drop, is attracted towards the substrate, leading to the formation of smaller drops at the needle tip. More importantly, however, the radial component of the electric field results in electrophoretic motion of the particles in the drop—during deposition—and a concentration of solid material at the centre of the drop (2).

Because of the large dimensions of the experimental model, a large electric potential needs to be applied to the needle compared to those required in the two embodiments. The nominal electric field strength required for electrophoretic motion of the particles in both examples is of the order of 1 kV/mm. When scaled to the actual dimensions of the two embodiments, potential differences, both between $V_2$ and $V_1$, and ground, in the range 1 to 100 V, and preferably in the range 5 to 50 V, will be required.

The invention claimed is:

1. A method of depositing ink on a substrate, the method including:

preparing an ink comprising a liquid vehicle and pigment particles dispersed in the vehicle, at least the pigment particles being electrically charged;

applying a first potential to an outlet nozzle for the ink;

applying at least a second potential to one or more auxiliary electrodes located adjacent the outlet nozzle; and expelling droplets of ink from the outlet nozzle towards a target zone on a substrate, wherein said one or more auxiliary electrodes are arranged to apply an electric field to a droplet of ink that has exited the nozzle, the configuration of the outlet nozzle and said one or more auxiliary electrodes, and the values of the first and second potentials, being selected to cause pigment particles to be concentrated electrophoretically toward the centre of said droplet of ink that has exited the nozzle as it falls, thereby to deposit a quantity of the pigment particles in the target zone having a higher concentration than the concentration of the pigment particles in the ink.

2. A method according to claim 1 wherein the pigment particles have a permanent charge.

3. A method according to claim 1 wherein the pigment particles have an induced charge.

4. A method according to claim 1 which is designed to utilise the applied potentials to cause radially inward electrophoretic motion of the pigment during the deposition process, to concentrate the pigment particles toward the centre of said droplet of ink and hence in the target zone.

5. A method according to claim 1 which is designed to utilise the applied potentials to generate electrohydrodynamic forces on the liquid vehicle of the droplet of ink, to cause the liquid vehicle to be dispersed away from the target zone.

6. A method according to claim 1 wherein the one or more auxiliary electrodes located adjacent the outlet nozzle are disposed coaxially around the electrode formed by the nozzle.

7. A method according to claim 1 wherein the substrate is maintained at a defined potential while droplets of ink are expelled from the nozzle towards the target zone.

8. A method according to claim 7 wherein the substrate is maintained at ground or earth potential.

9. A method according to claim 1 wherein the potential difference between the outlet nozzle and the one or more auxiliary electrodes is at least as great as the potential difference between the outlet nozzle and the substrate.

10. A method according to claim 9 wherein the potential difference between the outlet nozzle and the one or more auxiliary electrodes is in the range of 1 to 100V.

11. A method according to claim 1 comprising locating at least one auxiliary electrode behind the substrate, on a common axis with the electrode formed by the nozzle.

12. A method according to claim 11 wherein a base plate is provided to support the substrate, the base plate being maintained at a defined potential.

13. A method according to claim 12 wherein the base plate is maintained at ground or earth potential.

14. A method according to claim 12 wherein the base plate is located behind the substrate, with the substrate located between the nozzle and the base plate.

15. A method according to claim 12 wherein the base plate is located between the substrate and the nozzle.

16. A method according to claim 12 wherein the potential of the auxiliary electrode is maintained more attractive to the charged nanoparticles than the potential of the nozzle.

17. A method according to claim 16 wherein the ratio of the potentials of the auxiliary electrode and the nozzle is maintained greater than the ratio of the radius of a hole in the base plate adjacent the auxiliary electrode and the radius of the nozzle.

18. A method according to claim 11 wherein the nozzle and the auxiliary electrodes are kept in a fixed position and the substrate is moved relative thereto.

19. A method according to claim 11 wherein the nozzle and said at least one auxiliary electrode behind the substrate are movable relative to the substrate, the movement of the nozzle and said at least one auxiliary electrode being synchronized.

20. A method according to claim 11 wherein a plurality of electrodes and corresponding holes in a base plate are kept at fixed absolute positions.

* * * * *